United States Patent
Kishimoto et al.

(10) Patent No.: US 9,799,712 B2
(45) Date of Patent: Oct. 24, 2017

(54) METHOD OF MANUFACTURING LIGHT-EMITTING DISPLAY DEVICE WITH REDUCED PRESSURE DRYING

(71) Applicant: SAMSUNG DISPLAY CO., LTD., Yongin-si, Gyeonggi-do (KR)

(72) Inventors: Katsushi Kishimoto, Seoul (KR); Atsushi Kitabayashi, Hwaseong-si (KR); Jae Kwon Hwang, Seoul (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/209,799

(22) Filed: Jul. 14, 2016

(65) Prior Publication Data

US 2017/0207282 A1  Jul. 20, 2017

(30) Foreign Application Priority Data

Jan. 15, 2016 (KR) .................. 10-2016-0005163

(51) Int. Cl.
*H01L 21/02* (2006.01)
*H01L 27/32* (2006.01)
(Continued)

(52) U.S. Cl.
CPC ........ *H01L 27/3246* (2013.01); *H01L 51/002* (2013.01); *H01L 51/0007* (2013.01); *H01L 51/0026* (2013.01); *H01L 51/56* (2013.01); *H01L 51/0036* (2013.01); *H01L 51/0037* (2013.01); *H01L 51/0038* (2013.01); *H01L 51/0081* (2013.01); *H01L 51/5012* (2013.01);
(Continued)

(58) Field of Classification Search
CPC ............ G02F 1/1303; G02F 1/133516; G02F 1/1337; G02F 1/13363; Y10T 428/10; H01L 21/67034
USPC ................ 257/40; 438/46; 349/187, 123, 78
See application file for complete search history.

(56) References Cited

U.S. PATENT DOCUMENTS

2007/0026166 A1 *  2/2007  Gomi ................ G02F 1/1303
                                                      428/1.1
2008/0171252 A1 *  7/2008  Hirano ................ C08J 5/2256
                                                      429/483

(Continued)

FOREIGN PATENT DOCUMENTS

JP    2003-057432 A    2/2003
JP    2007-042708 A    2/2007
KR    10-2007-0117920 A    12/2007

*Primary Examiner* — Evan Pert
*Assistant Examiner* — Changhyun Yi
(74) *Attorney, Agent, or Firm* — Lee & Morse, P.C.

(57) ABSTRACT

A method of manufacturing a light-emitting display device, the method including forming a first electrode on a substrate for each pixel of a plurality of pixels; forming a pixel defining film on the first electrode such that the pixel defining film includes an opening exposing the first electrode; and forming an organic layer on the first electrode, wherein forming the organic layer includes providing an organic solution into the opening of the pixel defining film, and drying the organic solution by performing an exhaust process in a state where an air current is provided by using a drying gas such that the air current is sequentially composed of a position facing the organic solution, a position to which the organic solution is discharged, and a position facing the organic solution.

18 Claims, 10 Drawing Sheets

(51) Int. Cl.
  *H01L 51/56*   (2006.01)
  *H01L 51/00*   (2006.01)
  *H01L 51/50*   (2006.01)

(52) U.S. Cl.
  CPC ...... *H01L 51/5056* (2013.01); *H01L 51/5088* (2013.01); *H01L 2227/323* (2013.01)

(56) References Cited

U.S. PATENT DOCUMENTS

| | | | |
|---|---|---|---|
| 2008/0252200 A1* | 10/2008 | Wang | H01L 27/3246 313/504 |
| 2010/0223839 A1* | 9/2010 | Garcia-Perez | C01B 3/34 44/313 |
| 2012/0313055 A1* | 12/2012 | Yukinobu | C09D 5/24 252/519.5 |

* cited by examiner

METHOD OF MANUFACTURING LIGHT-EMITTING DISPLAY DEVICE WITH REDUCED PRESSURE DRYING

CROSS-REFERENCE TO RELATED APPLICATION

Korean Patent Application No. 10-2016-0005163, filed on Jan. 15, 2016, in the Korean Intellectual Property Office, and entitled: "Method of Manufacturing Light-Emitting Display Device," is incorporated by reference herein in its entirety.

BACKGROUND

1. Field

Embodiments relate to a method of manufacturing a light-emitting display device.

2. Description of the Related Art

Among light-emitting display devices, an organic light-emitting display device, which is a self-emission type display device, has attracted considerable attention as a next-generation display device because it has advantages of wide viewing angle, excellent contrast, and high-speed response.

The organic light-emitting display device includes an emission layer containing an organic luminous material between an anode electrode and a cathode electrode. When an anode voltage and a cathode voltage are respectively applied to these electrodes, holes discharged from the anode electrode are transferred to the emission layer through a hole injection layer and a hole transport layer, and are recombined with electrons in the emission layer. Excitons are generated by the recombination of holes and electrons, and these excitons are changed from an excited state to a ground state to allow the emission layer to emit light, thereby displaying an image.

SUMMARY

Embodiments are directed to a method of manufacturing a light-emitting display device.

The embodiments may be realized by providing a method of manufacturing a light-emitting display device, the method including forming a first electrode on a substrate for each pixel of a plurality of pixels; forming a pixel defining film on the first electrode such that the pixel defining film includes an opening exposing the first electrode; and forming an organic layer on the first electrode, wherein forming the organic layer includes providing an organic solution into the opening of the pixel defining film, and drying the organic solution by performing an exhaust process in a state where an air current is provided by using a drying gas such that the air current is sequentially composed of a position facing the organic solution, a position to which the organic solution is discharged, and a position facing the organic solution.

Drying the organic solution may be performed in a chamber, and drying the organic solution may include an initial drying process that includes lowering a pressure in the chamber from a first pressure to a second pressure as the air current is provided; a diffusion process that includes maintaining the pressure in the chamber at the second pressure as the air current is provided; and a residual solvent removing process that includes lowering the pressure in the chamber from the second pressure to a third pressure as the air current is provided.

The first pressure may be ambient atmospheric pressure, the second pressure is 100 torr to 20 torr, and the third pressure is $10^{-1}$ torr to $10^{-4}$ torr, and the drying gas that forms the air current may be supplied to the chamber at a flow rate of 3 standard liter per minute (SLM) to 5 SLM.

The initial drying process may be performed for 15 sec to 60 sec, and the diffusion process may be performed for 300 sec to 600 sec.

The diffusion process may further include heating the substrate to 80° C. to 100° C. using a heating device.

The initial drying process may include lowering the pressure in the chamber from ambient atmospheric pressure to 100 torr for 60 sec while supplying the drying gas at a flow rate of 3 SLM.

The diffusion process may include maintaining the pressure in the chamber at 100 torr for 300 sec while supplying the drying gas at a flow rate of 3 SLM.

The drying gas may include $N_2$ gas, Ar gas, $H_2$ gas, CO gas, or combinations thereof.

The drying gas used in the initial drying process, the diffusion process, and the residual solvent removing process may be $N_2$ gas.

The organic solution may include a mixed solvent of ethane-1,2-diol, $H_2O$, and propanol alkyl ether; a mixed solvent of diethylene glycol, a humectant, propanol, an inorganic additive, and perfluorinated polysulfonic acid; a mixed solvent that includes 1,3-dimethyl-2-imidazolidinone (DMI); a mixed solvent that includes cyclohexanol; a mixed solvent of 4-methylanisole, methyl 1-naphthyl ether, and 2-pyrrolidone; a mixed solvent of 1,2,3,4-tetrahydronaphthalene, methyl 1-naphthyl ether, 2-pyrrolidone, and perfluoralkylalkane; a mixed solvent of 4-methylanisole and cyclohexylbenzene; or a mixed solvent of methyl benzoate and diethyl phthalate.

The drying gas used in the initial drying process, the diffusion process, and the residual solvent removing process may be $N_2+H_2$ gas or $N_2+CO$ gas.

The organic solution may include a mixed solvent of diethylene glycol, a humectant, propanol, an inorganic additive, and perfluorinated polysulfonic acid; a mixed solvent that includes DMI; a mixed solvent that includes cyclohexanol; a mixed solvent of 4-methylanisole, methyl 1-naphthyl ether, and 2-pyrrolidone; a mixed solvent of 1,2,3,4-tetrahydronaphthalene, methyl 1-naphthyl ether, 2-pyrrolidone, and perfluoralkylalkane; a mixed solvent of 4-methylanisole and cyclohexylbenzene; or a mixed solvent of methyl benzoate and diethyl phthalate.

The drying gas used in the initial drying process and the residual solvent removing process may be $N_2+H_2$ gas or $N_2+CO$ gas, and the drying gas used in the diffusion process may be $N_2$ gas.

The organic layer may include poly(3,4-ethylenedioxythiophene)/polystyrene sulfonate; N,N'-di-1-naphthyl-N,N'-diphenyl-1,1'-biphenyl-4,4'-diamine; poly(3,4-ethylenedioxythiophene); N,N'-di(naphthalen-1-yl)-N,N'-diphenylbenzidine; tris(8-quinolinorate)aluminum; or poly(p-phenylenevinylene).

The organic layer may include a hole injection layer on the first electrode; a hole transport layer on the hole injection layer; or an emission layer on the hole transport layer.

The embodiments may be realized by providing a method of forming an organic film pattern, the method including forming a bank on a substrate such that the bank defines a plurality of openings; providing an organic solution into the openings; and drying the organic solution by performing an exhaust process in a state where an air current is provided by using a drying gas such that the air current is sequentially composed of a position facing the organic solution, a position to which the organic solution is discharged, and a position facing the organic solution.

Drying the organic solution may be performed in a chamber, and drying the organic solution may include an initial drying process that includes lowering a pressure in the chamber from a first pressure to a second pressure as the air current is provided; a diffusion process that includes maintaining the pressure in the chamber at the second pressure as the air current is provided; and a residual solvent removing process that includes lowering the pressure in the chamber from the second pressure to a third pressure as the air current is provided.

The first pressure may be ambient atmospheric pressure, the second pressure is 100 torr to 20 torr, and the third pressure is $10^{-1}$ torr to $10^{-4}$ torr, and the drying gas forming the air current may be supplied to the chamber at a flow rate of 3 standard liter per minute (SLM) to 5 SLM.

The diffusion process may further include heating the substrate to 80° C. to 100° C. using a heating device.

The drying gas may be $N_2$ gas, Ar gas, $H_2$ gas, CO gas, or combinations thereof.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
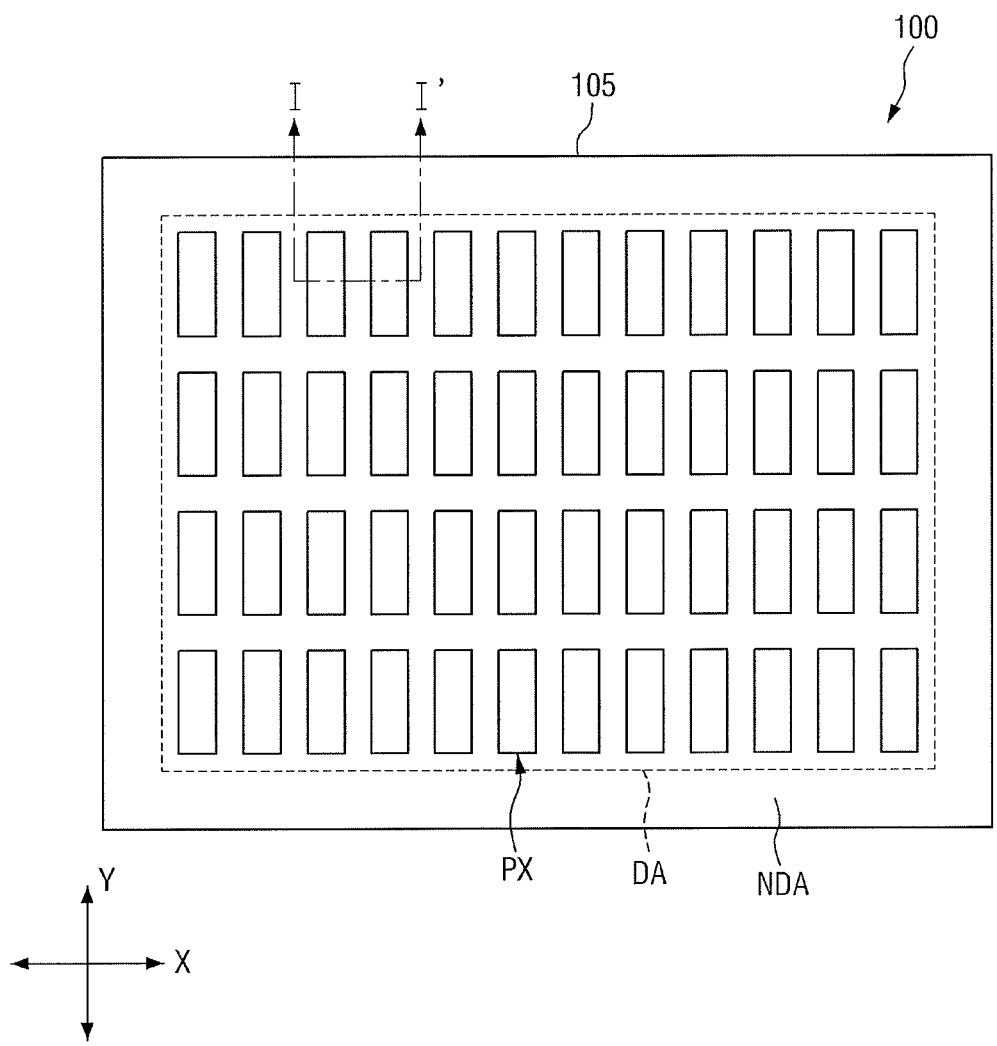
FIG. 1 illustrates a schematic plan view of pixels of a light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of the present application.

Figure 2:
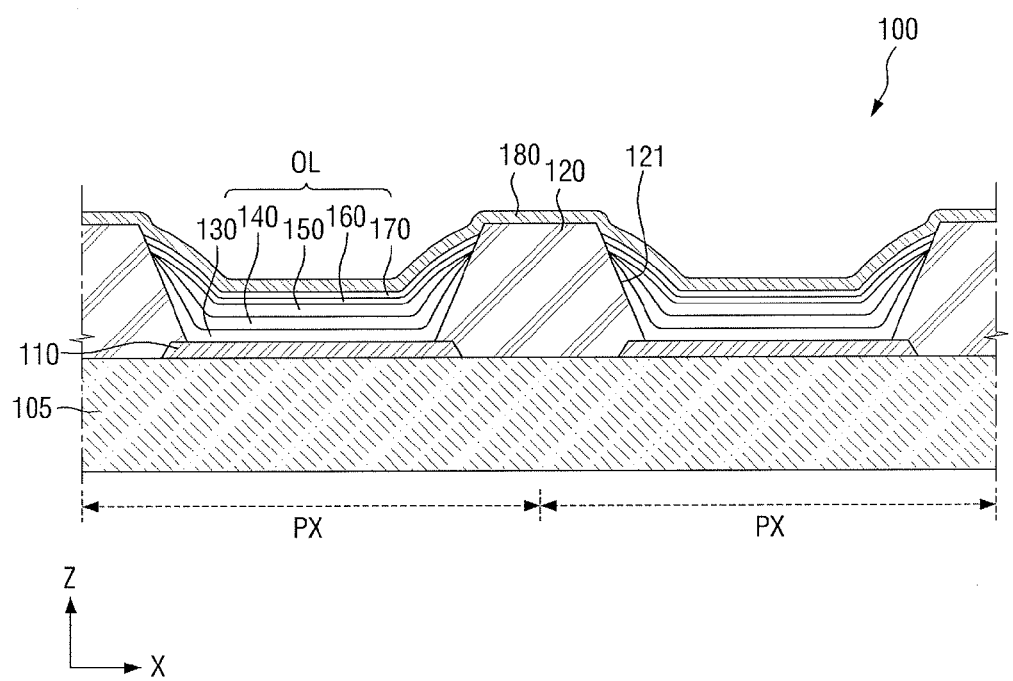
FIG. 2 illustrates a cross-sectional view taken along the line I-I' of FIG. 1.

FIG. 1 illustrates a schematic plan view showing pixels of a light-emitting display device according to an embodiment, and FIG. 2 illustrates a cross-sectional view taken along the line I-I' of FIG. 1.

Referring to FIGS. 1 and 2, a light-emitting display device 100 according to an embodiment may include a substrate 105, a first electrode 110, a pixel defining film 120, an organic layer OL, and a second electrode 180. These members may be sequentially laminated in a Z-axis direction of FIG. 2.

The substrate 105 may include a display area DA (including a plurality of pixels PX displaying an image) and a non-display area NDA (located outside the display area DA). The plurality of pixels PX may be arranged along a first direction (X-axis direction) and a second direction (Y-axis direction) crossing the first direction to have a matrix form, and may include a red pixel emitting red light, a green pixel emitting green light, and a blue pixel emitting blue light.

The substrate 105 may include an insulating substrate. The insulating substrate may be formed of a transparent glass material containing transparent $SiO_2$ as a main component. In an implementation, the insulating substrate may be made of an opaque material, or may be made of a plastic material. In an implementation, the insulating substrate may be a flexible substrate.

In an implementation, the substrate 105 may further include other structures formed on the insulating substrate. Examples of other structures may include a wiring, an electrode, an insulating film, and the like. In an implementation, the substrate 105 may include a plurality of thin film transistors. At least one drain electrode of the plurality of thin film transistors may be electrically connected to the first electrode 110. The thin film transistor may include an active region made of, e.g., amorphous silicon, polycrystalline silicon, or monocrystalline silicon. In an implementation, the thin film transistor may include an active region made of, e.g., an oxide semiconductor.

The first electrode 110 may be on the substrate 105 for or corresponding to each pixel PX. For example, each pixel PX may include one first electrode 110. The first electrode 110 may be an anode electrode for receiving signals applied to the drain electrode of the thin film transistor and providing holes to an emission layer 150 of the organic layer OL, or may be a cathode electrode for receiving the signals applied to the drain electrode of the thin film transistor and providing electrons to the emission layer 150 of the organic layer OL.

The first electrode 110 may be a transparent electrode or a reflective electrode. When the first electrode 110 is a transparent electrode, this first electrode 110 may be made of indium tin oxide (ITO), indium zinc oxide (IZO), zinc oxide (ZnO), or $In_2O_3$. When the first electrode 110 is a reflective electrode, this first electrode 110 may be fabricated by forming a reflective film using Ag, Mg, Al, Pt, Pd, Au, Ni, Nd, Ir, Cr, or a compound thereof and then applying ITO, IZO, ZnO or $In_2O_3$ onto the reflective film. In an implementation, the first electrode 110 may be formed by photolithography.

The pixel defining film 120 is formed on the substrate 105 and may have an opening 121 exposing the first electrode 110. The pixel defining film 120 may divide or separate the respective pixels PX on the substrate 105. The pixel defining film 120 may facilitate the formation of the organic layer OL on the first electrode 110 through the opening 121. The pixel defining film 120 may be made of an insulating material. For example, the pixel defining film 120 may be made of benzocyclobutene (BCB), polyimide (PI), polyamide (PA), acryl resin, or phenol resin. In an implementation, the pixel defining film 120 may be made of an inorganic material such as silicon nitride.

In an implementation, when the organic layer OL (e.g., a hole injection layer 130, a hole transport layer 140, and/or an emission layer 150) is formed by discharging or providing an organic solution (e.g., a hole injection solution, a hole transport solution, and a light-emitting solution) into the opening 121 of the pixel defining film 120 using a solution coating method, such as ink-jet printing or nozzle printing, the pixel defining film 120 may have liquid repellency in order to prevent the organic solution from going out of the opening 121 of the pixel defining film 120. For this purpose, the pixel defining film 120 may be formed of an insulating material allowing the contact angle of the organic solution to the pixel defining film 120 to be about 40° or more. In an implementation, the pixel defining film 120 may be made of an organic insulating material, such as a polymer resin containing fluorine. For example, the pixel defining film may be made of benzocyclobutene (BCB), polyimide (PI), polyamide (PA), acryl resin, and/or phenol resin. In an implementation, the pixel defining film 120 may be formed by photolithography. The ink-jet printing method is a method of dropping a printing solution at desired positions in the form of ink droplets. The nozzle printing is a meth of flowing a printing solution along the line including desired positions.

The organic layer OL may be formed on the first electrode 110 that is exposed through the opening 121 in the pixel defining film 120. The organic layer OL may include, e.g., a hole injection layer 130, a hole transport layer 140, an emission layer 150, an electron transport layer 160, and/or an electron injection layer 170.

The hole injection layer 130 may be in the opening 121 of the pixel defining film 120 along the first electrode 110 and a lateral side of the pixel defining film 120. The hole injection layer 130 may be formed by providing a hole injection solution (including a hole injection material and a solvent) into the opening 121 of the pixel defining film 120 using a solution coating method, e.g., ink-jet printing or nozzle printing and drying the hole injection solution. In this case, the hole injection layer 130 may have a thickness that is reduced from the first electrode 110 toward the lateral side of the pixel defining film 120. The reason for this is that the pixel defining film 120 may have a predetermined wettability relative to the hole injection solution even though the pixel defining film 120 is formed to have liquid repellency.

The hole injection layer 130, which is a buffer layer for lowering energy barrier between the first electrode 110 and the hole transport layer 140, may facilitate injection of holes from the first electrode 110 into the hole transport layer 140. For this purpose, the hole injection layer 130 may be made of a hole injection material having appropriate electrical conductivity and hole conductivity. In an implementation, the hole injection layer 130 may include, e.g., MTDATA (4,4',4''-tris(3-methylphenylphenylamino)triphenylamine), CuPc (copper phthalocyanine), or PEDOT/PSS (poly(3,4-ethylenedioxythiophene)/polystyrene sulfonate).

The hole transport layer 140 may be on the hole injection layer 130 in the opening 121 of the pixel defining film 120. The hole transport layer 140 may be formed by providing a hole transport solution (including a hole transport material and a solvent) into the opening 121 of the pixel defining film 120 using a solution coating method, e.g., ink-jet printing or nozzle printing, and drying the hole transport solution. In this case, the hole transport layer 140 may have a thickness that is reduced from the first electrode 110 toward the lateral side of the pixel defining film 120. The reason for this is that the pixel defining film 120 may have a predetermined wettability to the hole transport solution even though the pixel defining film 120 is formed to have liquid repellency.

The hole transport layer 140 may transport the holes from the hole injection layer 130 to the emission layer 150. The hole transport layer 140 may be made of a hole transport material having lower electrical conductivity than the hole injection layer 130. For example, the hole transport layer 140 may include NPD (N,N-di-1-naphthyl-N,N'-diphenyl-1,1'-biphenyl-4,4'-diamine), TPD (N,N-diphenyl-N,N'-bis (3-methylphenyl)-1,1'-bi-phenyl-4,4'-diamine), PEDOT (poly(3,4-ethylenedioxythiophene)), or NPB (N,N'-di(naphthalen-1-yl)-N,N'-diphenyl-benzidine).

The emission layer 150 may be on the hole transport layer 140 in the opening 121 of the pixel defining film 120. The emission layer 150 may be formed by providing a light-emitting solution (including a luminous material and a solvent) into the opening 121 of the pixel defining film 120 using a solution coating method, e.g., ink-jet printing or nozzle printing and drying the light-emitting solution. In this case, the emission layer 150 may have a thickness that is reduced from the first electrode 110 toward the lateral side of the pixel defining film 120. The reason for this is that the pixel defining film 120 may have a predetermined wettability to the light-emitting solution even though the pixel defining film 120 is formed to have liquid repellency.

The emission layer 150 may emit light by recombining the holes provided from the first electrode with electrons provided from the second electrode 180. For example, when holes and electrons are provide to the emission layer 150, the holes and electrons are recombined with each other to generate excitons, and these excitons are changed from an excited state to a ground state to allow the emission layer 150 to emit light. The emission layer 150 may be made of a luminous material having lower electrical conductivity than the hole injection layer 130 and having similar electrical conductivity to the hole transport layer 140. The emission layer 150 may include a red emission layer for emitting red light, a green emission layer for emitting green light, and a blue emission layer for emitting blue light.

The red emission layer may include a host and a red dopant. Examples of the host of the red emission layer may include $Alq_3$ (tris(8-quinolinorate)aluminum), CBP (4,4'-N, N'-dicarbazol-biphenyl), PVK (poly(n-vinylcarbazole)), ADN (9,10-Di(naphthyl-2-yl)anthracene), TCTA (4,4',4''-tris(N-carbazolyl)triphenylamine), TPBI (1,3,5-tris(N-phenylbenzimidazol-2-yl)benzene), TBADN (3-tert-butyl-9,10-di(naphth-2-yl)anthracene), E3 (terfluorene), and DSA (distyrylarylene).

The green emission layer may include a green luminous material or include a host or a green dopant. As the host of the green emission layer, the host of the red emission layer may be used. Examples of the green dopant may include $Ir(ppy)_3$, $Ir(ppy)_2(acac)$, and $Ir(mpyp)_3$.

The blue emission layer may include a blue luminous material or include a host or a blue dopant. As the host of the blue emission layer, the host of the red emission layer may be used. Examples of the blue dopant may include $F_2Irpic$, $(F_2ppy)_2Ir(tmd)$, $Ir(dfppz)_3$, terfluorene, DPAVBi (4,4'-bis(4-diphenylaminostyryl) biphenyl), and TBPe (2,5,8,11-tetra-tert-butyl perylene).

The electron transport layer 160 may be on the emission layer 150. The electron transport layer 160 may transport the electrons from the second electrode 180 through the electron injection layer 170 to the emission layer 150. The electron transport layer 160 may be made of an organic compound, e.g., Bphen (4,7-diphenyl-1,10-phenanthroline), BAlq (aluminum(III)bis(2-methyl-8-hydroxyquinolinato)4-phenylphenolate), $Alq_3$(tris(8-quinolinorate)aluminum), $Bebq_2$ (berylliumbis(benzoquinolin-10-olate), and/or TPBI (1,3,5-tris(N-phenylbenzimidazole-2-yl)benzene). In an implementation, the electron transport layer 160 may be formed by deposition.

The electron injection layer 170 may be on the electron transport layer 160. The electron injection layer 170, which is a buffer layer for lowering energy barrier between the electron transport layer 160 and the second electrode 180, may facilitate injection of the holes from the second electrode 180 into the electron transport layer 160. For example, the electron injection layer 170 may be made of LiF or CsF. In an implementation, the electron injection layer 170 may be formed by deposition.

The second electrode 180 may be on the electron injection layer 170, and may be a cathode electrode providing electrons to the emission layer 150 or an anode electrode providing holes to the emission layer 150. The second electrode 180, similar to the first electrode 110, may be a transparent electrode or a reflective electrode. In an implementation, the second electrode 180 may be formed by deposition.

In an implementation, the light-emitting display device 100 may further include a sealing substrate on the second electrode 180. The sealing substrate may be an insulating substrate. A spacer may be disposed between the second electrode 180 and the sealing substrate on the pixel defining film 120. In an implementation, the sealing substrate may be omitted. In this case, a sealing film made of an insulating material may cover and protect all the structures.

As described above, the light-emitting display device according to an embodiment may include the hole injection layer 130, the hole transport layer 140, and the emission layer 150, which are formed by a printing method including a simple manufacturing process, thereby realizing a display device through a simple manufacturing process.

Hereinafter, a method of manufacturing the light-emitting display device 100 according to an embodiment will be described.

Figure 3:
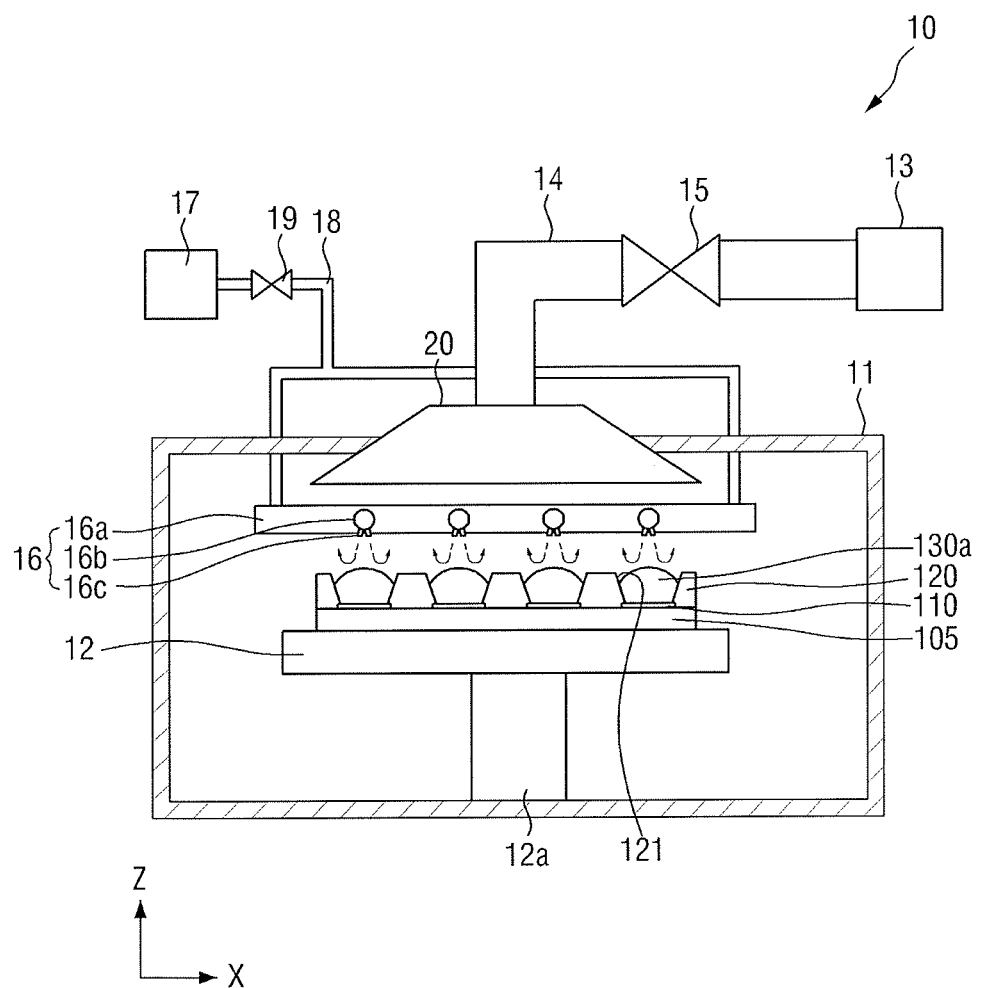
FIG. 3 illustrates a schematic view of a drying apparatus that is used in the drying process of a hole injection solution discharged in a pixel defining film in a method of manufacturing the light-emitting display device of FIG. 2.
Figure 4:
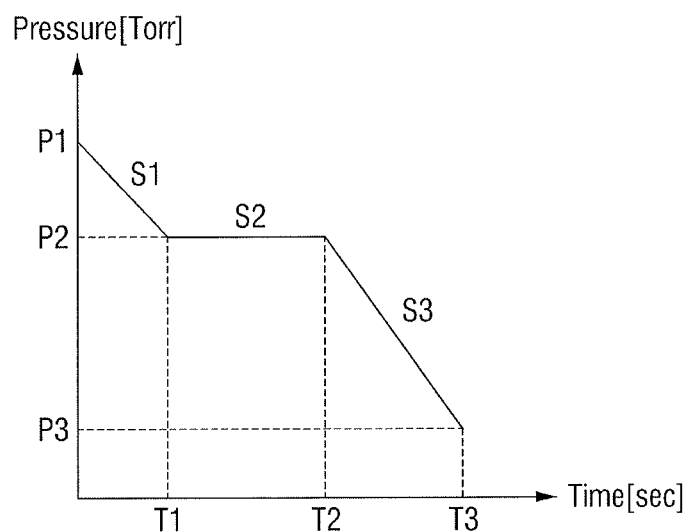
FIG. 4 illustrates a graph showing an example of the order of the drying process of the hole injection solution of FIG. 3.
Figure 5:
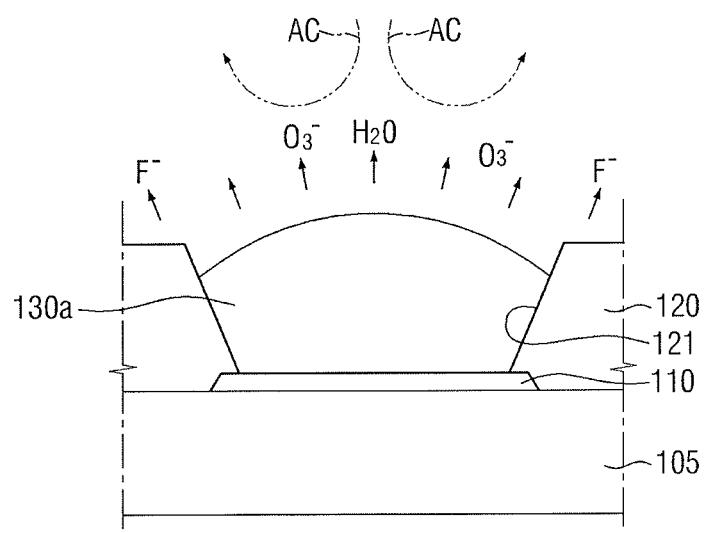
FIG. 5 illustrates a cross-sectional view showing the drying of the hole injection solution in the initial drying process of FIG. 4.
Figure 6:
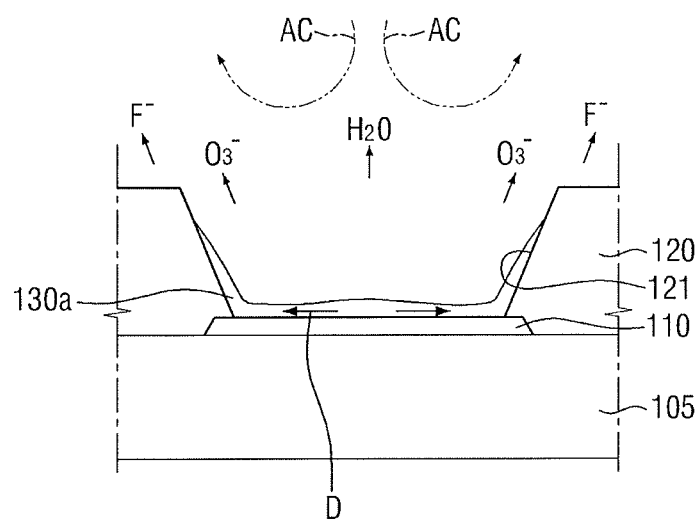
FIG. 6 illustrates a cross-sectional view showing the drying of the hole injection solution in the diffusion process of FIG. 4.
Figure 7:
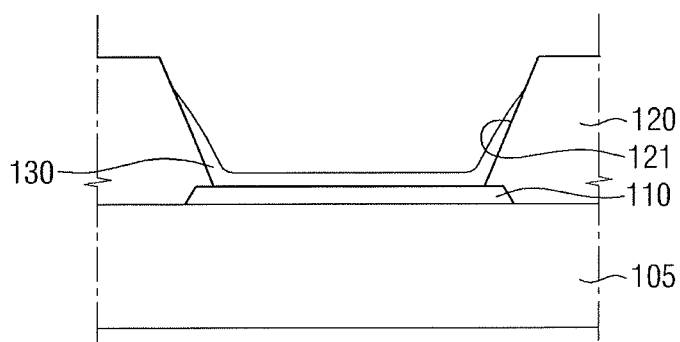
FIG. 7 illustrates a cross-sectional view showing a hole injection layer formed by drying the hole injection solution by the diffusion process of FIG. 6.
Figure 8:
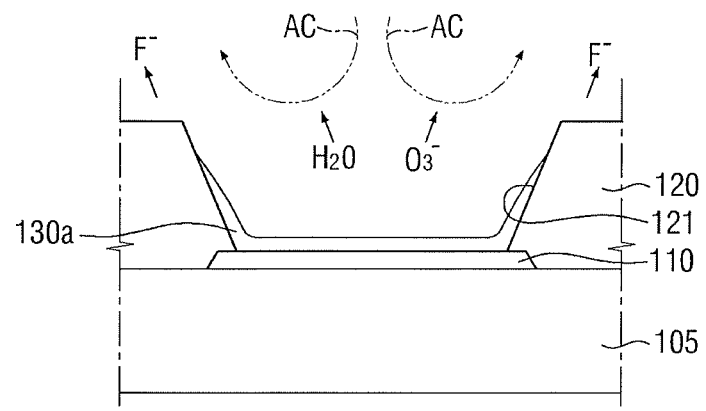
FIG. 8 illustrates a cross-sectional view showing a state in which the residual solvent removing process of FIG. 4 is performed on the hole injection layer.

FIG. 3 illustrates a schematic view of a drying apparatus that is used in the drying process of a hole injection solution discharged in a pixel defining film in a method of manufacturing the light-emitting display device of FIG. 2; FIG. 4 illustrates a graph showing an example of the order of the drying process of the hole injection solution of FIG. 3; FIG. 5 illustrates a cross-sectional view showing the drying of the hole injection solution in the initial drying process of FIG. 4; FIG. 6 illustrates a cross-sectional view showing the drying of the hole injection solution in the diffusion process of FIG. 4; FIG. 7 illustrates a cross-sectional view showing a hole injection layer formed by drying the hole injection solution by the diffusion process of FIG. 6; and FIG. 8 illustrates a cross-sectional view showing a state in which the residual solvent removing process of FIG. 4 is performed on the hole injection layer.

First, a first electrode 110 may be formed on a substrate 105 including a plurality of pixels (PX of FIG. 1) such that one first electrode 110 is formed for each pixel PX, and a pixel defining film 120 (dividing the pixels PX and having an opening 120 exposing the first electrode 110) may be formed on the substrate 105.

The first electrode 110 may be formed by depositing and patterning at least one of a transparent electrode material and a reflective electrode material on the substrate 105. The plurality of pixels (PX of FIG. 1) may include a red pixel emitting red light, a green pixel emitting green light, and a blue pixel emitting blue light.

The pixel defining film 120 may be formed by depositing an insulating material on an entire surface of the substrate 105 (e.g., to cover the first electrode 110) and patterning the deposited insulating material.

Meanwhile, when the organic layer OL (e.g., a hole injection layer 130, a hole transport layer 140, and an emission layer 150) is formed by providing an organic solution (e.g., a hole injection solution, a hole transport solution, and a light-emitting solution) into the opening 121 of the pixel defining film 120 using a solution coating method, such as ink-jet printing or nozzle printing, the pixel defining film 120 may have liquid repellency in order to help prevent the organic solution from going out of the opening 121 of the pixel defining film 120. For this purpose, the pixel defining film 120 may be formed of an insulating material allowing the contact angle of the organic solution to the pixel defining film 120 to be about 40° or more.

Subsequently, the hole injection layer (130 of FIG. 2) of the organic layer (OL of FIG. 2) may be formed on the first electrode 110.

For example, a hole injection solution 130a (including a hole injection material and a solvent) may be applied onto the first electrode 110 in the opening 121 of the pixel defining film 120 using a solution coating method such as ink-jet printing or nozzle printing. Then, when the hole injection solution 130a in the opening 121 of the pixel defining film 120 may be dried by a reduced pressure drying method using a drying apparatus 10 of FIG. 3, the hole injection layer (130 of FIG. 2) may be formed.

Referring to FIG. 3, the drying apparatus 10 may include, e.g., a chamber 11, a support 12, an exhaust device 13, an exhaust pipe 14, a pressure control valve 15, a gas spray unit 16, a gas supply source 17, a gas supply pipe 18, a gas supply control valve 19, and a hood 20.

The chamber 11 may provide a space for drying the hole injection solution 130a in the opening 121 of the pixel defining film 120 on the substrate 105. In an implementation, a side wall of the chamber 11 may be provided with an inlet for introducing the substrate 105 and an outlet for sending or extricating the substrate 105.

The support 12 may be disposed at a lower portion of the inside of the chamber 11, and may support the substrate 105 in the chamber 11. The support 12 may be supported by a support column 12a. In an implementation, the support 12 may include a lifting mechanism for adjusting the height of the support 12 thereon with the substrate 105, e.g., a lift pin. In an implementation, the support 12 may further include a heating device for heating the substrate 105 to aid the drying of the hole injection solution 130a in the opening 121 of the pixel defining film 120 on the substrate 105 through an exhaust process.

The exhaust device 13 may be disposed outside the chamber 11, and may perform a pressure action for discharging the gas in the chamber 11 to the outside of the chamber 11. The exhaust device 13 may be composed of at least one of a dry pump and a turbo pump.

The exhaust pipe 14 may be disposed between the exhaust device 13 and the chamber 11. The exhaust pipe may serve as a passage for discharging the gas in the chamber 11 to the outside of the chamber 11 when an exhaust process is performed by the exhaust device 13.

The pressure control valve 15 may be provided in the exhaust pipe 14. The pressure control valve 15 may control the pressure action caused by the exhaust device 13 by adjusting an opening degree of the exhaust pipe 14.

When the exhaust device 13 is operated and the opening degree of the pressure control valve 15 is adjusted, a reduced pressure exhaust process for reducing the pressure in the chamber 11 from ambient atmospheric pressure (e.g., about 760 torr) to a predetermined reduced pressure may be performed, and thus drying of the hole injection solution 130a in the opening 121 of the pixel defining film 120 on the substrate 105 may be performed.

The gas spray unit 16 may be disposed over the support 12 in the chamber 11. The gas spray unit 16 may receive a drying gas, e.g., an inert gas, from the gas supply source 17 and may spray the drying gas toward the substrate 105 on the support 12. The gas spray unit 16 may include, e.g., at least one gas distribution pipe 16a, a plurality of gas spray pipes 16b, and a plurality of gas spray holes 16c.

The gas distribution pipe 16a may extend along the first direction (X-axis direction), and may be connected with the gas supply pipe 18. The gas distribution pipe 16a may receive drying gas supplied from the gas supply source 17 through the gas supply pipe 18, and may distribute the drying gas to the plurality of gas spray pipes 16b.

The plurality of gas spray pipes 16b may extend from the gas distribution pipe 16a along the second direction (Y-axis direction), and may be connected with the gas distribution pipe 16a. The plurality of gas spray pipes 16b may receive drying gas from the gas distribution pipe 16a.

The plurality of gas spray holes 16c may be disposed at a portion of each gas spray pipe 16b, the portion facing the support 12. The plurality of gas spray holes 16c may provide a passage for spraying the drying gas in each gas spray pipe 16b toward the substrate 105 on the support 12.

The drying gas sprayed toward the substrate 105 may form an air current allowing the gas, moisture, and impurities generated at the time of evaporation of a solvent from the hole injection solution to flow toward the exhaust pipe 14 over the chamber 11 during the exhaust process for drying the hole injection solution 130a in the opening 121 of the pixel defining film 120 on the substrate 105, thereby reducing absorption of the gas, moisture, and impurities generated at the time of evaporation of the solvent of the hole injection solution 130a, while shortening the exhaust passage of the gas, moisture, and impurities generated at the time of evaporation of the solvent.

The gas supply source 17 may store drying gas and may supply the drying gas into the chamber 11. In an implementation, the drying gas may include, e.g., $N_2$ gas, Ar gas, $H_2$ gas, CO gas, or combinations thereof.

The gas supply pipe 18 may be disposed between the gas supply source 17 and the gas distribution pipe 16a, and may form a passage for supplying the drying gas from the gas supply source 17 to the gas distribution pipe 16a.

The gas supply control valve 19 may adjust the opening degree of the gas supply pipe 18 to control a flow rate and spray speed of the drying gas supplied from the gas supply source 17 to the gas distribution pipe 16a.

The hood 20 may be disposed between the support and the exhaust pipe 14 at an upper portion of the chamber 11. The hood 20 may guide the gas, moisture, and impurities generated at the time of evaporation of a solvent from the hole injection solution 130a to flow toward the exhaust pipe 14 when the drying of the hole injection solution 130a in the opening 121 of the pixel defining film 120 on the substrate 105 proceeds. The size of the hood 20 may be equal to or larger than that of the substrate 105, and it is possible to help prevent the gas, moisture, and impurities generated at the time of evaporation of the solvent from the hole injection solution 130a from being attached to another space other than the exhaust pipe 14, e.g., the inner wall of the chamber 11, during the exhaust process for drying the hole injection solution 130a. If the gas, moisture, and impurities generated at the time of evaporation of the solvent from the hole injection solution 130a were to be attached to the inner wall of the chamber 11, they could be absorbed into the hole injection solution 130a during the exhaust process, thereby acting as contaminants.

Referring to FIG. 4, the process of drying the hole injection solution in the opening 121 of the pixel defining film 120 through a reduced pressure drying method using the drying apparatus 10 may include an initial drying process S1, a diffusion process S2, and a residual solvent removing process S3. In the graph of FIG. 4, the horizontal axis represents time, and the vertical axis represents pressure in the chamber (11 of FIG. 3).

First, in the initial drying process S1, the substrate 105, on which the hole injection solution is provided in the opening 121 of the pixel defining film 120, may be introduced into the chamber 11 and fixed on the support 12, and then the exhaust device 13 may be operated to exhaust the inside of the chamber 11 under reduced pressure. Simultaneously, drying gas, such as $N_2$ gas, supplied from the gas supply source 17 to the gas supply pipe 18 may be sprayed into the chamber 11, e.g., toward the hole injection solution 130a in the opening 121 of the pixel defining film 120 through the plurality of gas spray holes 16c. In this case, as shown in FIG. 5, $N_2$ gas may form an air current AC, which is sequentially composed of a position facing the hole injection solution 130a, a position to which the hole injection solution 130a is discharged, and a position facing the hole injection solution 130a, over the hole injection solution 130a. For example, the air current AC may flow in a circular pattern such that the air current flows toward the hole injection solution 130a, over the hole injection solution 130a, and away from the hole injection solution 130a to complete a circular cycle that is repeated. When the inside of the chamber 11 is exhausted under reduced pressure in a state where such an air current AC is formed, about 90% of a solvent may be evaporated from the hole injection solution 130a, and simultaneously the absorption of the gas, moisture, and impurities generated at the time of evaporation of the solvent (e.g., $O_3^-$, $H_2O$, and $F^-$ that may be evaporated from the pixel defining film 120) into the hole injection solution 130a may be reduced.

In an implementation, in the initial drying process S1, the exhaust process may be performed for the first time up to the first time point T1, e.g., about 15 sec to about 60 sec, such that the pressure in the chamber 11 is changed from first pressure P1 (e.g., ambient atmospheric pressure) to second pressure P2 (e.g., down to about 100 torr to about 20 torr). In this case, $N_2$ gas supplied from the gas supply source 17 to the gas supply pipe 18 may have a flow rate of about 3 SLM (standard liter per minute) to about 5 SLM. In an implementation, in the initial drying process S1, when the exhaust process is performed for about 60 sec such that the pressure in the chamber is 100 torr and the $N_2$ gas supplied from the gas supply source 17 to the gas supply pipe 18 has a flow rate of about 3 SLM (standard liter per minute), there may be an effect in reducing the absorption of the gas, moisture, and impurities generated at the time of evaporation of the solvent from the hole injection solution 130a into the hole injection solution 130a.

The solvent of the hole injection solution 130a, into which $N_2$ gas supplied from the gas supply source 17 to the gas supply pipe 18 is applied, may be, e.g., a mixed solvent of ethane-1,2-diol, $H_2O$, and propanol alkyl ether; a mixed solvent of diethylene glycol, a humectant, propanol, an inorganic additive, and perfluorinated polysulfonic acid; a mixed solvent containing DMI (1,3-dimethyl-2-imidazolidinone); or a mixed solvent containing cyclohexanol (e.g., a mixed solvent of cyclohexanol and DMI (1,3-dimethyl-2-imidazolidinone)).

Subsequently, in the diffusion process S2, the pressure in the chamber 11 may be maintained at the second pressure P2 until the second time T2 by maintaining the exhaust process and $N_2$ gas spray by the operation of the exhaust device. Here, the time for which the second pressure P2 is maintained corresponds with a difference between the second time point T2 and the first time point T1, and may be about 300 sec to about 600 sec. As such, when the pressure in the chamber 11 is maintained at the second pressure P2 by the exhaust process and $N_2$ gas spray by the operation of the exhaust device 13, as shown in FIG. 6, about 10% of a solvent of the hole injection solution 130a may be evaporated while the air current is maintained. In this case, about 10% of a solvent of the hole injection solution 130a may be evaporated while contributing to the diffusion D or spreading of a hole injection material, and the absorption of the gas, moisture, and impurities generated at the time of evaporation of the solvent (e.g., $O_3^-$, $H_2O$, and $F^-$ that may be evaporated from the pixel defining film 120) into the hole injection solution 130a may be reduced. Therefore, as shown in FIG. 7, the hole injection layer 130 formed by the drying of the hole injection solution 130a may be flattened without attachment of impurities. In an implementation, in the diffusion process S2, when the pressure in the chamber 11 is maintained at 100 torr for 300 sec, the flatness of the hole injection layer 130 formed by the drying of the hole injection solution 130a may be high.

In an implementation, in the diffusion process S2, a procedure of heating the substrate 105 using a heating device of the support 12 may be additionally performed in order to aid the drying of the hole injection solution 130a. In this case, a heating temperature caused by the heating device may be about 80° C. to about 100° C.

Subsequently, in the residual solvent removing process S3, a reduced pressure exhaust for lowering the pressure in the chamber 11 from the second pressure P2 to the third pressure P3 may be performed by controlling the operation of the exhaust device 13 while maintaining the spray of $N_2$ gas. In an implementation, the third pressure P3 may be about $10^{-1}$ torr to about $10^{-4}$ torr. In the diffusion process S2 or the residual solvent removing process S3, most of the solvent of the hole injection solution 130a may be evaporated by performing the reduced pressure exhaust. However, even when the solvent remains in the hole injection layer 130, as shown in FIG. 8, the residual solvent can be removed from the hole injection layer 130 while the air current is maintained. In an implementation, the third time point T3 at which the residual solvent removing process S3 is completed (e.g., the length of time that the residual solvent removing process S3 is performed) may be changed depending on the kind of the solvent of the hole injection solution 130a.

The hole injection solution 130a may be dried through the above procedure, thereby improving film characteristics and forming the flat hole injection layer 130.

Subsequently, the hole transport layer (140 of FIG. 2) may be formed on the hole injection layer (130 of FIG. 2).

For example, a hole transport solution (including a hole transport material and a solvent) may be provided onto the hole injection layer (130 of FIG. 2) in the opening 121 of the pixel defining film 120 using a solution coating method such as ink-jet printing or nozzle printing. Then, when the hole transport solution in the opening 121 of the pixel defining film 120 is dried by a reduced pressure drying method using the drying apparatus 10 of FIG. 3, the hole transport layer (140 of FIG. 2) may be formed.

The drying method of the hole transport solution may be the same as that of the hole injection solution 130a, and a description thereof may be be omitted.

In an implementation, the solvent of the hole transport solution, to which the spray of $N_2$ gas supplied from the gas supply source 17 to the gas supply pipe 18 is applied, may include, e.g., a mixed solvent of 4-methylanisole, methyl 1-naphthyl ether, and 2-pyrrolidone; a mixed solvent of 1,2,3,4-tetrahydronaphthalene, methyl 1-naphthyl ether, 2-pyrrolidone, and perfluoralkylalkane; or a mixed solvent of 4-methylanisole and cyclohexylbenzene.

Subsequently, the emission layer (150 of FIG. 2) may be formed on the hole transport layer (140 of FIG. 2).

For example, a light-emitting solution (including a luminous material and a solvent) may be provided onto the hole transport layer (140 of FIG. 2) in the opening 121 of the pixel defining film 120 using a solution coating method such as ink-jet printing or nozzle printing. Then, when the light-emitting solution in the opening 121 of the pixel defining film 120 is dried by a reduced pressure drying method using the drying apparatus 10 of FIG. 3, the emission layer (150 of FIG. 2) is formed.

The drying method of the light-emitting solution may be the same as that of the hole injection solution 130a, a description thereof will be omitted.

In an implementation, the solvent of the light-emitting solution, to which the spray of $N_2$ gas supplied from the gas supply source 17 to the gas supply pipe 18 is applied, may include, e.g., a mixed solvent of methyl benzoate and diethyl phthalate or a mixed solvent of 4-methylanisole and cyclohexylbenzene.

Subsequently, the electron transport layer (160 of FIG. 2), the electron injection layer (170 of FIG. 2), and the second electrode (180 of FIG. 2) may be sequentially is formed on the emission layer (150 of FIG. 2). The electron transport layer (160 of FIG. 2), the electron injection layer (170 of FIG. 2), and the second electrode (180 of FIG. 2) may be formed by deposition.

In an implementation, the method of manufacturing a light-emitting device according to an embodiment may further include disposing a sealing substrate on the second electrode 180. In an implementation, the method of manufacturing a light-emitting device according to an embodiment may further include disposing a spacer between the second electrode 180 and the sealing substrate. Various suitable methods for disposing the sealing substrate and disposing the spacer may be used.

In the method of manufacturing a light-emitting device according to an embodiment, drying gas, e.g., $N_2$ gas, may be sprayed to form an air current that shortens the exhaust passage of the gas, moisture, and impurities generated at the time of evaporation of a solvent from an organic solution, thereby reducing the absorption of the gas, moisture, and impurities generated at the time of evaporation of the solvent from the organic solution into the organic solution.

The method of manufacturing a light-emitting device according to an embodiment may include a diffusion process or spreading process during which the pressure in the chamber 11 is maintained at predetermined pressure for a predetermined period of time by maintaining the exhaust process caused by the operation of the exhaust device 13 and the spray of $N_2$ gas into the organic solution during the drying of the organic solution, so that an organic material may be diffused or spread by a small amount of the solvent in a state where most of the solvent has been evaporated from the organic solvent, thereby forming a flat organic layer.

Thus, in the method of manufacturing a light-emitting device according to an embodiment, film characteristics may be improved, and the organic layer having high flatness may be formed, thereby improving the luminous efficiency of the light-emitting display device.

Accordingly, it is possible to manufacture a light-emitting display device having improved display quality and life span.

Next, a method of manufacturing the light-emitting display device 100 according to another embodiment will be described.

Figure 9:
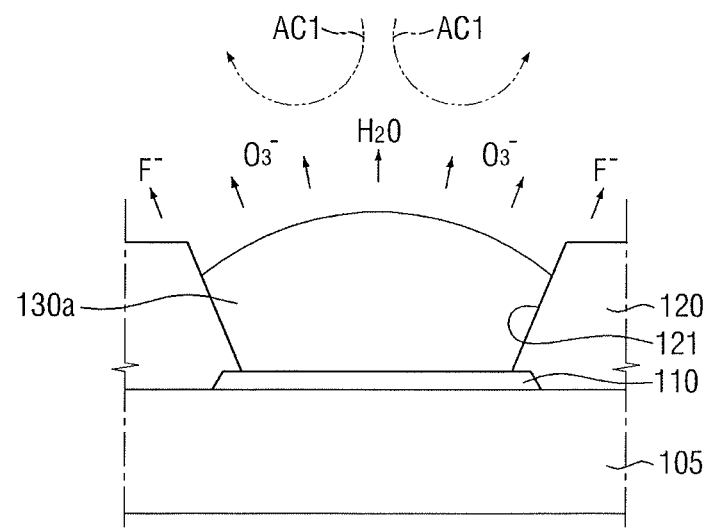
FIG. 9 illustrates a cross-sectional view showing the drying of the hole injection solution in the initial drying process of FIG. 4 in a method of manufacturing a light-emitting display device according to another embodiment.
Figure 10:
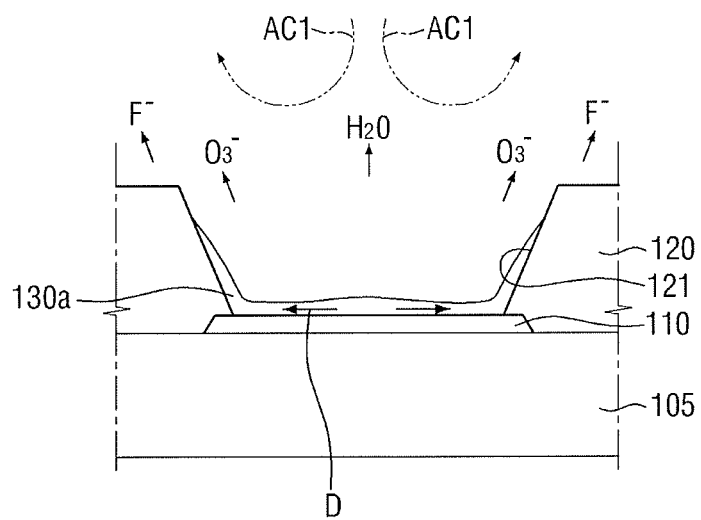
FIG. 10 illustrates a cross-sectional view showing the drying of the hole injection solution in the diffusion process of FIG. 4 in a method of manufacturing a light-emitting display device according to another embodiment.
Figure 11:
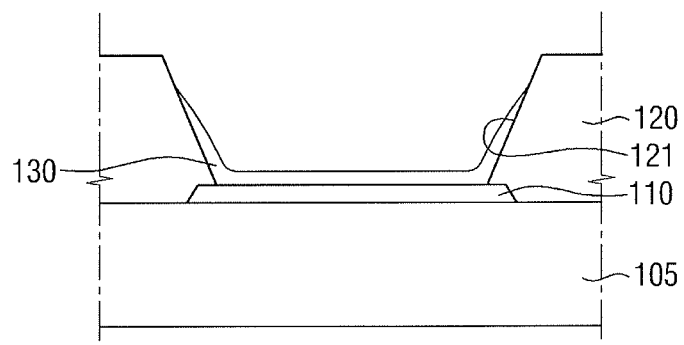
FIG. 11 illustrates a cross-sectional view showing a hole injection layer formed by drying the hole injection solution by the diffusion process of FIG. 10.
Figure 12:
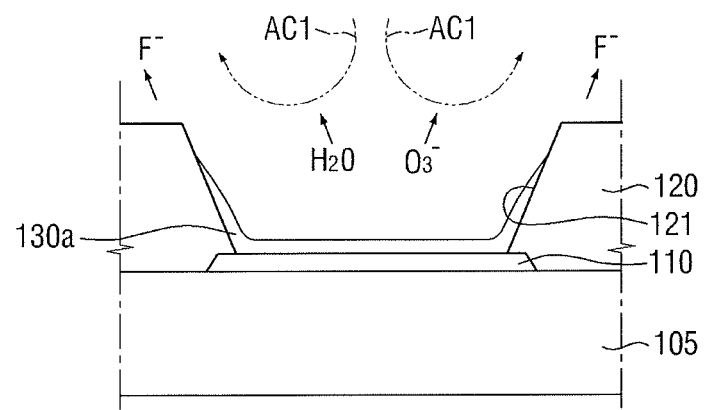
FIG. 12 illustrates a cross-sectional view showing a state in which the residual solvent removing procedure of FIG. 4 is performed on the hole injection layer in a method of manufacturing a light-emitting display device according to another embodiment.

FIG. 9 illustrates a cross-sectional view showing the drying of the hole injection solution in the initial drying process of FIG. 4 in a method of manufacturing a light-emitting display device according to another embodiment; FIG. 10 illustrates a cross-sectional view showing the drying of the hole injection solution in the diffusion process of FIG. 4 in a method of manufacturing a light-emitting display device according to another embodiment; FIG. 11 illustrates a cross-sectional view showing a hole injection layer formed by drying the hole injection solution spread by the diffusion process of FIG. 10; and FIG. 12 illustrates a cross-sectional view showing a state in which the residual solvent removing procedure of FIG. 4 is performed on the hole injection layer in a method of manufacturing a light-emitting display device according to another embodiment.

The method of manufacturing a light-emitting display device according to the present embodiment is the same as the aforementioned embodiment except that a hole injection layer forming method, a hole transport layer forming method, and an emission layer forming method are different. Therefore, in method of manufacturing a light-emitting display device according to the present embodiment, a hole injection layer forming method, a hole transport layer forming method, and an emission layer forming method will be described.

First, in the step of forming the hole injection layer (130 of FIG. 2) of the organic layer (OL of FIG. 2) on the first electrode 110, the method of providing the hole injection solution 130a onto the first electrode in the opening of the pixel defining film 120 is the same as the aforementioned method.

Here, the drying method of the hole injection solution in the opening 121 of the pixel defining film 120 may be similar to the aforementioned drying method using the drying apparatus 10 of FIG. 3, but an air current AC1 may be formed by using $N_2+H_2$ gas or $N_2+CO$ gas as the drying gas to be sprayed onto the hole injection solution 130a.

The air current AC1 formed by $N_2+H_2$ gas or $N_2+CO$ gas, as shown in FIGS. 9 to 12 (corresponding to FIGS. 4 to 8), may be advantageous in reducing the absorption of $O_3^-$ into the hole injection solution 130a and reducing moisture at the time of evaporation of a solvent from the hole injection solution 130a.

The solvent of the hole injection solution, into or onto which $N_2+H_2$ gas or $N_2+CO$ gas is sprayed, may include, e.g., a mixed solvent of diethylene glycol, a humectant, propanol, an inorganic additive, and perfluorinated polysulfonic acid; a mixed solvent containing DMI (1,3-dimethyl-2-imidazolidinone); or a mixed solvent containing cyclohexanol (e.g., a mixed solvent of cyclohexanol and DMI (1,3-dimethyl-2-imidazolidinone)).

Subsequently, in the step of forming the hole transport layer (140 of FIG. 2) on the hole injection layer (130 of FIG. 2), the method of providing a hole transport solution onto the hole injection layer (130 of FIG. 2) in the opening of the pixel defining film 120 is the same as the aforementioned method.

Here, the drying method of the hole transport solution in the opening 121 of the pixel defining film 120 may be similar to the aforementioned drying method using the drying apparatus 10 of FIG. 3, but the drying method may be performed by using $N_2+H_2$ gas or $N_2+CO$ gas as the drying gas to be sprayed onto the hole transport solution.

The solvent of the hole transport solution, on which $N_2+H_2$ gas or $N_2+CO$ gas is sprayed, may include, e.g., a mixed solvent of 4-methylanisole, methyl 1-naphthyl ether, and 2-pyrrolidone; a mixed solvent of 1,2,3,4-tetrahydronaphthalene, methyl 1-naphthyl ether, 2-pyrrolidone, and perfluoroalkylalkane; or a mixed solvent of 4-methylanisole and cyclohexylbenzene.

Subsequently, in the step of forming the emission layer (150 of FIG. 2) on the hole transport layer (140 of FIG. 2), the method of providing a light-emitting solution onto the hole transport layer (140 of FIG. 2) in the opening of the pixel defining film 120 may be the same as the aforementioned method.

Here, the drying method of the light-emitting solution in the opening 121 of the pixel defining film 120 may be similar to the aforementioned drying method using the drying apparatus 10 of FIG. 3, but the drying method may be performed by using $N_2+H_2$ gas or $N_2+CO$ gas as the drying gas to be sprayed onto the light-emitting solution.

The solvent of the light-emitting solution, onto which $N_2+H_2$ gas or $N_2+CO$ gas is sprayed, may include, e.g., a mixed solvent of methyl benzoate and diethyl phthalate or a mixed solvent of 4-methylanisole and cyclohexylbenzene.

As described above, in the method of manufacturing a light-emitting display device according to present embodiment, an organic film vulnerable to $O_3^-$ or moisture may be formed or used, due to the use of $N_2+H_2$ gas or $N_2+CO$ gas as the drying gas to be sprayed onto the organic solution during the exhaust process for drying the organic solution.

Next, a method of manufacturing the light-emitting display device 100 according to still another embodiment will be described.

Figure 13:
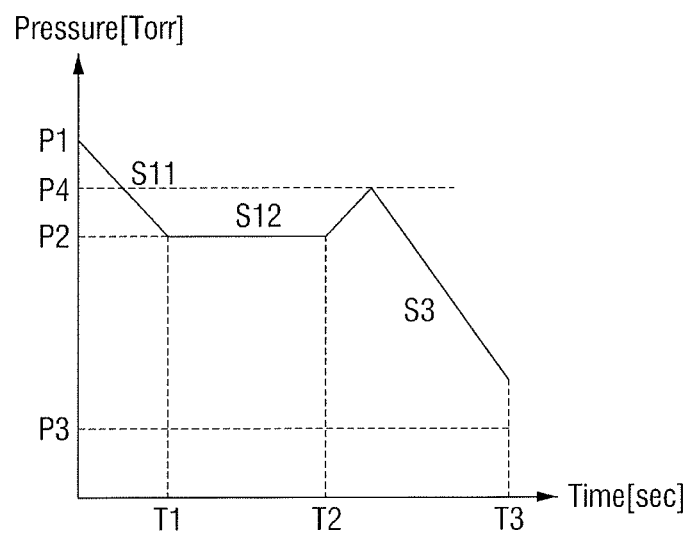
FIG. 13 illustrates a graph showing an example of the order of the drying process of the hole injection solution in a method of manufacturing a light-emitting display device according to still another embodiment.
Figure 14:
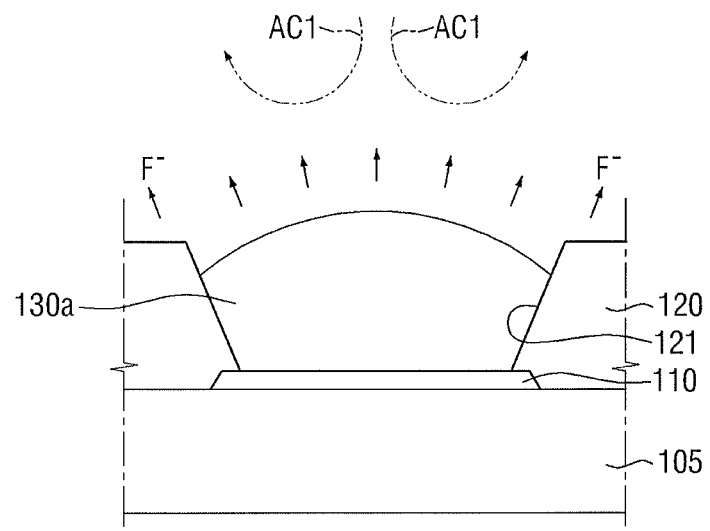
FIG. 14 illustrates a cross-sectional view showing the drying of the hole injection solution in the initial drying process of FIG. 13.
Figure 15:
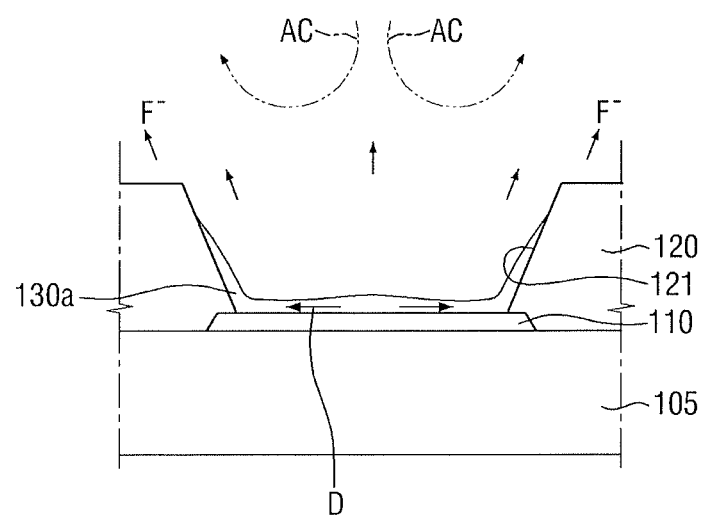
FIG. 15 illustrates a cross-sectional view showing the drying of the hole injection solution in the diffusion process of FIG. 13.
Figure 16:
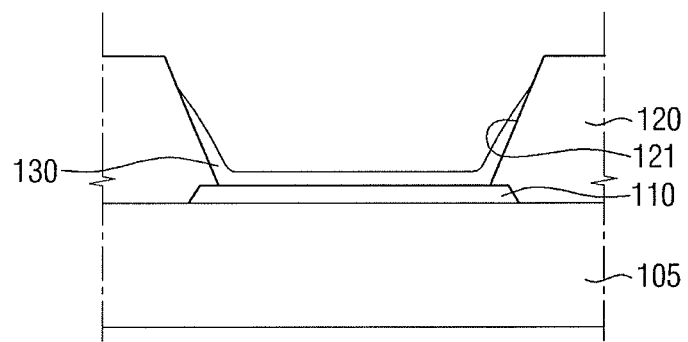
FIG. 16 illustrates a cross-sectional view showing a hole injection layer formed by drying the hole injection solution by the diffusion process of FIG. 15.
Figure 17:
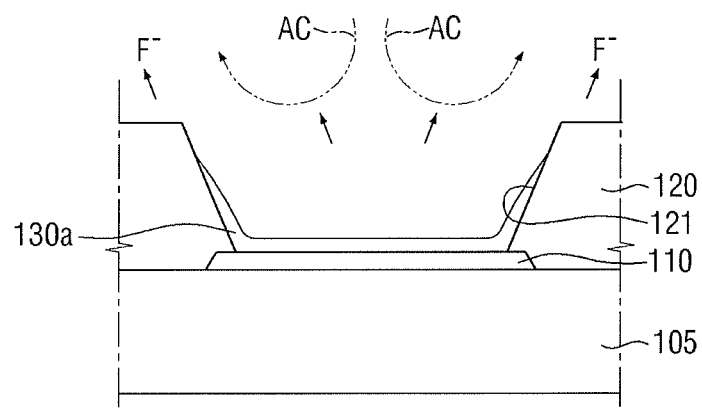
FIG. 17 illustrates a cross-sectional view showing the drying of the hole injection solution in the residual solvent removing process of FIG. 13.

FIG. 13 illustrates a graph showing an example of the order and timing of the drying process of the hole injection solution in a method of manufacturing a light-emitting display device according to still another embodiment; FIG. 14 illustrates a cross-sectional view showing the drying of the hole injection solution in the initial drying process of FIG. 13; FIG. 15 illustrates a cross-sectional view showing the drying of the hole injection solution in the diffusion process of FIG. 1; FIG. 16 illustrates a cross-sectional view showing a hole injection layer formed by drying the hole injection solution by the diffusion process of FIG. 15; and FIG. 17 illustrates a cross-sectional view showing the drying of the hole injection solution in the residual solvent removing process of FIG. 13.

The method of manufacturing a light-emitting display device according to the present embodiment is the same as the aforementioned embodiments, except that a hole injection layer forming method, a hole transport layer forming method, and an emission layer forming method are different. Therefore, in method of manufacturing a light-emitting display device according to the present embodiment, a hole injection layer forming method, a hole transport layer forming method, and an emission layer forming method will be described.

First, in the step of forming the hole injection layer (130 of FIG. 2) of the organic layer (OL of FIG. 2) on the first electrode 110, the method of providing the hole injection solution 130a onto the first electrode in the opening of the pixel defining film 120 is the same as the aforementioned method.

Here, the drying method of the hole injection solution discharged in the opening 121 of the pixel defining film 120 may be similar to the aforementioned drying method using the drying apparatus 10 of FIG. 3, but, in the initial drying process S11, an air current AC1 is formed by using $N_2+H_2$ gas or $N_2+CO$ gas as the drying gas to be sprayed onto the hole injection solution 130a, in the diffusion process S12, an air current AC is formed by using $N_2$ gas as the drying gas to be sprayed onto the hole injection solution 130a, and in the residual solvent removing process S13, an air current AC1 is formed by using $N_2+H_2$ gas or $N_2+CO$ gas as the drying gas to be sprayed onto the hole injection solution 130a.

In this case, as shown in FIG. 14, the air current AC1 formed by $N_2+H_2$ gas or $N_2+CO$ gas in the initial drying process S11 may facilitate a reduction in the absorption of $O_3^-$ into the hole injection solution 130a at the time of evaporating a solvent from the hole injection solution 130a and may help reduce moisture.

Further, as shown in FIG. 15, the air current AC formed by $N_2$ gas in the diffusion process S12 may not be significantly involved in the reduction of $O_3^-$ and moisture, and a hole injection layer (130 of FIG. 16) requiring oxygen may be formed in the diffusion process S12. For example, the hole injection layer (130 of FIG. 16) requiring oxygen may be made of PEDOT/PSS (poly(3,4-ethylenedioxythiophene)/polystyrene sulfonate).

Further, as shown in FIG. 17, the air current AC1 formed by $N_2+H_2$ gas or $N_2+CO$ gas in the residual solvent removing process S13 may facilitate a reduction or removal of $O_3^-$ and moisture when a solvent remains in the hole injection layer 130 formed through the diffusion process S12. In the residual solvent removing process S13, $N_2+H_2$ gas or $N_2+CO$ gas may be used in addition to $N_2$ gas of the diffusion process S12, and the pressure in the chamber 11 may increase to the fourth pressure P4 (between the first pressure P1 and the second pressure P2), and then may decrease to the third pressure P3.

Subsequently, the hole transport layer (140 of FIG. 2) may be formed on the hole injection layer (130 of FIG. 2).

The step of forming the hole transport layer (140 of FIG. 2) may be the same as the step of forming the hole injection layer (130 of FIG. 2).

In an implementation, the hole transport layer requiring oxygen in the diffusion process S12 may include, e.g., NPD (N,N-di-1-naphthyl-N,N'-diphenyl-1,1'-biphenyl-4,4'-diamine), PEDOT (poly(3,4-ethylenedioxythiophene)), or NPB (N,N'-di(naphthalen-1-yl)-N,N'-diphenyl-benzidine).

Subsequently, the emission layer (150 of FIG. 2) may be formed on the hole transport layer (140 of FIG. 2).

The step of forming the emission layer (150 of FIG. 2) is the same as the step of forming the hole injection layer (130 of FIG. 2).

In an implementation, the hole transport layer requiring oxygen in the diffusion procedure S12 may include, e.g., $Alq_3$ (tris(8-quinolinorate)aluminum) and/or PPV (poly(p-phenylenevinylene)).

As described above, in the method of manufacturing a light-emitting display device according to the present embodiment, an organic layer that requires oxygen in the diffusion process S12 may be formed by using $N_2$ gas as the drying gas to be sprayed into the organic solution during the diffusion process S12 during the exhaust process for drying the organic solution.

In the method of manufacturing a light-emitting display device, a case that the drying apparatus of FIG. 3 is used in the step of forming the organic film has been described. In an implementation, the drying apparatus of FIG. 3 may be used even in other fields of forming an organic film pattern by drying the organic solution discharged in the opening of a bank defining a plurality of openings on the substrate in addition to the field of light-emitting display devices. In this case, the steps of drying the organic solution using the drying apparatus of FIG. 3 are the same as or similar to the aforementioned steps.

By way of summation and review, an organic light-emitting display device may include a pixel defining layer having an opening exposing the anode electrode formed in each of pixels arranged on a substrate in a matrix form, and may be configured such that a hole injection layer, a hole transport layer, an emission layer, an electron transport layer, an electron injection layer, and a cathode electrode are sequentially formed on the anode electrode exposed through the opening. Among these, the hole injection layer, the hole transport layer, and the emission layer may be formed in a thin film form by discharging or providing an organic solution (including an organic material and a solvent) into the opening of the pixel defining film using a solution coating method, e.g., ink-jet printing or nozzle printing, and drying the organic solution.

Drying of the organic solution that has been provided in the opening of the pixel defining film may be performed by a reduced-pressure drying method in which a substrate provided with the pixel defining film having the opening charged or filled with the organic solution is put into a chamber, and then a solvent is evaporated from the organic solution while reducing the pressure in the chamber through an exhaust process.

When the solvent is evaporated from the organic solution through the exhaust process, a part of the solvent or other impurities may be absorbed into the organic solution or the thin film. In this case, the characteristics of the thin film formed by drying the organic solution could be deteriorated and decrease luminous efficiency, thereby deteriorating the display quality and life span of the organic light-emitting display device.

According to the method of manufacturing a light-emitting display device, the deterioration in display quality and life span of the light-emitting display device may be reduced.

The embodiments may provide a method of manufacturing a light-emitting display device, by which the deterioration in display quality and life span of the light-emitting display device can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a light-emitting display device, the method comprising:
    forming a first electrode on a substrate for each pixel of a plurality of pixels;
    forming a pixel defining film on the first electrode such that the pixel defining film includes an opening exposing the first electrode; and
    forming an organic layer on the first electrode,
    wherein forming the organic layer includes:
    providing an organic solution into the opening of the pixel defining film, and
    drying the organic solution by performing an exhaust process in a state where an air current is provided by using a drying gas such that the air current is sequentially composed of a position facing the organic solution, a position to which the organic solution is discharged, and a position facing the organic solution,
    wherein:
    drying the organic solution is performed in a chamber, and drying the organic solution includes:
        an initial drying process that includes lowering a pressure in the chamber from a first pressure to a second pressure as the air current is provided;
        a diffusion process that includes maintaining the pressure in the chamber at the second pressure as the air current is provided; and
        a residual solvent removing process that includes lowering the pressure in the chamber from the second pressure to a third pressure as the air current is provided.

2. The method as claimed in claim 1, wherein:
the first pressure is ambient atmospheric pressure, the second pressure is 100 torr to 20 torr, and the third pressure is $10^{-1}$ torr to $10^{-4}$ torr, and
the drying gas that forms the air current is supplied to the chamber at a flow rate of 3 standard liter per minute (SLM) to 5 SLM.

3. The method as claimed in claim 2, wherein:
the initial drying process is performed for 15 sec to 60 sec, and
the diffusion process is performed for 300 sec to 600 sec.

4. The method as claimed in claim 2, wherein the diffusion process further includes heating the substrate to 80° C. to 100° C. using a heating device.

5. The method as claimed in claim 1, wherein the initial drying process includes lowering the pressure in the chamber from ambient atmospheric pressure to 100 torr for 60 sec while supplying the drying gas at a flow rate of 3 SLM.

6. The method as claimed in claim 5, wherein the diffusion process includes maintaining the pressure in the chamber at 100 torr for 300 sec while supplying the drying gas at a flow rate of 3 SLM.

7. The method as claimed in claim 1, wherein the drying gas includes $N_2$ gas, Ar gas, $H_2$ gas, CO gas, or combinations thereof.

8. The method as claimed in claim 1, wherein the drying gas used in the initial drying process, the diffusion process, and the residual solvent removing process is $N_2$ gas.

9. The method as claimed in claim 8, wherein the organic solution includes a mixed solvent of ethane-1,2-diol, $H_2O$, and propanol alkyl ether; a mixed solvent of diethylene glycol, a humectant, propanol, an inorganic additive, and perfluorinated polysulfonic acid; a mixed solvent that includes 1,3-dimethyl-2-imidazolidinone (DMI); a mixed solvent that includes cyclohexanol; a mixed solvent of 4-methylanisole, methyl 1-naphthyl ether, and 2-pyrrolidone; a mixed solvent of 1,2,3,4-tetrahydronaphthalene, methyl 1-naphthyl ether, 2-pyrrolidone, and perfluoroalkylalkane; a mixed solvent of 4-methylanisole and cyclohexylbenzene; or a mixed solvent of methyl benzoate and diethyl phthalate.

10. The method as claimed in claim 1, wherein the drying gas used in the initial drying process, the diffusion process, and the residual solvent removing process is $N_2+H_2$ gas or $N_2+CO$ gas.

11. The method as claimed in claim 10, wherein the organic solution includes a mixed solvent of diethylene glycol, a humectant, propanol, an inorganic additive, and perfluorinated polysulfonic acid; a mixed solvent that includes DMI; a mixed solvent that includes cyclohexanol;

a mixed solvent of 4-methylanisole, methyl 1-naphthyl ether, and 2-pyrrolidone; a mixed solvent of 1,2,3,4-tetrahydronaphthalene, methyl 1-naphthyl ether, 2-pyrrolidone, and perfluoroalkylalkane; a mixed solvent of 4-methylanisole and cyclohexylbenzene; or a mixed solvent of methyl benzoate and diethyl phthalate.

12. The method as claimed in claim 1, wherein:
the drying gas used in the initial drying process and the residual solvent removing process is $N_2+H_2$ gas or $N_2+CO$ gas, and
the drying gas used in the diffusion process is $N_2$ gas.

13. The method as claimed in claim 12, wherein the organic layer includes poly(3,4-ethylenedioxythiophene)/polystyrene sulfonate; N,N'-di-1-naphthyl-N,N'-diphenyl-1,1'-biphenyl-4,4'-diamine; poly(3,4-ethylenedioxythiophene); N,N'-di(naphthalen-1-yl)-N,N'-diphenyl-benzidine; tris(8-quinolinorate)aluminum; or poly(p-phenylenevinylene).

14. The method as claimed in claim 1, wherein the organic layer includes a hole injection layer on the first electrode; a hole transport layer on the hole injection layer; or an emission layer on the hole transport layer.

15. A method of forming an organic film pattern, the method comprising:
forming a bank on a substrate such that the bank defines a plurality of openings;
providing an organic solution into the openings; and
drying the organic solution by performing an exhaust process in a state where an air current is provided by using a drying gas such that the air current is sequentially composed of a position facing the organic solution, a position to which the organic solution is discharged, and a position facing the organic solution,
wherein:
drying the organic solution is performed in a chamber, and drying the organic solution includes:
an initial drying process that includes lowering a pressure in the chamber from a first pressure to a second pressure as the air current is provided;
a diffusion process that includes maintaining the pressure in the chamber at the second pressure as the air current is provided; and
a residual solvent removing process that includes lowering the pressure in the chamber from the second pressure to a third pressure as the air current is provided.

16. The method as claimed in claim 15, wherein:
the first pressure is ambient atmospheric pressure, the second pressure is 100 torr to 20 torr, and the third pressure is $10^{-1}$ torr to $10^{-4}$ torr, and
the drying gas forming the air current is supplied to the chamber at a flow rate of 3 standard liter per minute (SLM) to 5 SLM.

17. The method as claimed in claim 15, wherein the diffusion process further includes heating the substrate to 80° C. to 100° C. using a heating device.

18. The method as claimed in claim 15, wherein the drying gas is $N_2$ gas, Ar gas, $H_2$ gas, CO gas, or combinations thereof.

* * * * *